United States Patent [19]

Lin et al.

[11] Patent Number: 5,726,081
[45] Date of Patent: Mar. 10, 1998

[54] METHOD OF FABRICATING METAL CONTACT OF ULTRA-LARGE-SCALE INTEGRATION METAL-OXIDE SEMICONDUCTOR FIELD EFFECT TRANSISTOR WITH SILICON-ON-INSULATOR STRUCTURE

[75] Inventors: Chih-Hung Lin, Yi-Lan; Gary Hong, Hsin-Chu, both of Taiwan

[73] Assignee: United Microelectronics Corp., Taipei, Taiwan

[21] Appl. No.: 544,659

[22] Filed: Oct. 18, 1995

[51] Int. Cl.⁶ .................................................. H01L 21/84
[52] U.S. Cl. ........................ 438/163; 438/164; 438/300; 438/657
[58] Field of Search ................. 437/44, 21, 40 TFT, 437/41 TFT, 41 RG, 41 SM, 200, 201; 148/DIG. 19, DIG. 147; 438/151, 163, 164, 300, 302, 655, 657

[56] References Cited

U.S. PATENT DOCUMENTS

| | | | |
|---|---|---|---|
| 5,116,771 | 5/1992 | Karulkar | 437/21 |
| 5,231,038 | 7/1993 | Yamaguchi et al. | 437/41 RG |
| 5,238,857 | 8/1993 | Sato et al. | 437/44 |
| 5,439,836 | 8/1995 | Giffard | 437/21 |
| 5,485,028 | 1/1996 | Takahashi et al. | 257/347 |
| 5,567,966 | 10/1996 | Hwang | 257/347 |

FOREIGN PATENT DOCUMENTS

| | | |
|---|---|---|
| 62-57252 | 3/1987 | Japan. |
| 2-90569 | 3/1990 | Japan. |
| 3-55829 | 3/1991 | Japan. |

OTHER PUBLICATIONS

Y. yamaguchi et al., IEEE Trans. Electron Dev., 39(5)(1992)1179 "Self–Aligned Silicide ... Untra–Thin SIMOX MOSFET's".
D. Hisamoto et al., IEDM '92 Proc., p. 829. "Ultra–Thin SOI CMOS with Selective CVD W ...".
S. Wolf, "Silicon Processing for the VLSI Era" vol. II, pp. 144–149 Jun. 1990.

Primary Examiner—Charles L. Bowers, Jr.
Assistant Examiner—Leon Radomsky
Attorney, Agent, or Firm—Baker & Botts, L.L.P.

[57] ABSTRACT

In a method for fabricating a ULSI MOSFET with SOI structure, an additional polysilicon layer is used to form polysilicon/metal compound metal contacts on source and drain regions and a gate so as to avoid leakage current and short channel effect problems.

16 Claims, 4 Drawing Sheets

METHOD OF FABRICATING METAL CONTACT OF ULTRA-LARGE-SCALE INTEGRATION METAL-OXIDE SEMICONDUCTOR FIELD EFFECT TRANSISTOR WITH SILICON-ON-INSULATOR STRUCTURE

FIELD OF THE INVENTION

The present invention relates to a method of forming metal contacts of an ultra-large-scale integration (ULSI) metal-oxide-semiconductor field effect transistor (MOSFET) with silicon-on-insulator structure (SOI), especially to a method of forming metal contacts of a ULSI MOSFET with SOI structure which can prevent large leakage current and short channel effect.

BACKGROUND OF THE INVENTION

SOI structure is used in fabricating ULSI MOSFET elements, reducing floating body effect and parasitic capacitance. FIGS. 1a to 1d show the process of forming a conventional ULSI MOSFET with SOI structure. As shown in FIG. 1a, P well 11 is formed on an oxide layer 10. Gate oxide 12 is then formed and polysilicon gate layer 13 is deposited.

As shown in FIG. 1b, polysilicon gate 14 is defined by well know technology. N-type impurities are implanted to form source region and drain region 15. A silicon dioxide layer is deposited and then patterning the gate sidewall spacer 16. As shown in FIG. 1c, a metal layer of titanium or nickel is formed on the substrate with a thickness of about 400 to 600 angstrom. Then, a rapid thermal processing (RTP) step is performed, the salicide metal contacts (polysilicon/metal compond) will be formed on the gate 14, source 15 and drain 15 regions, the salicides contacts with the metal layer are used to prevent the sheet resistivity from being too high due to thin source and drain regions 15. After that, a selective etching step is performed. Since the metal layer will not react with the gate sidewall spacer 16, the metal is removed by using an etchant for etching metals. The salicide layers 17, i.e. the metal contacts, are formed on the gate 14 and the source and drain regions 15 respectively in the rapid thermal process as shown in FIG. 1d. After the metal layer is removed, another rapid thermal process will be performed to reduce the sheet resistivity.

However, the ULSI MOSFET with SOI structure element produced according to the above procedures have some deficiencies. Since the thickness of the drain and source regions 15 is small, it will be reduced due to the formation of the salicide layer 17, besides, the thickness of the residual drain and source regions will be difficult to control. If the thickness of residual drain and source regions are too thin, the leakage current will be too large, and even short circuit may occur.

SUMMARY OF THE INVENTION

It is therefore an object for the present invention to eliminate the shortcomings of leakage current, short channel effect and short circuit of a conventional ULSI MOSFET with SOI structure.

The object of the present invention is fulfilled by providing a process for fabricating a ULSI MOSFET with SOI structure on an SOI wafer, comprising the following steps of: forming a well of Ptype on the SOI wafer, depositing a first polysilicon layer and defining a channel region thereon, forming a gate oxide layer thereon, depositing a gate polysilicon layer and defining a gate thereon, implanting impurities of Ntype to form source and drain regions, forming sidewall spacers beside the gate, depositing a metal layer thereon, performing a rapid thermal process, and removing the metal layer.

BRIEF DESCRIPTION OF THE DRAWING

The present invention will become better understood by reference to the following detailed description, which taken in conjunction with the accompanying drawings, wherein.

DETAILED DESCRIPTION OF THE PREFERRED EMBODIMENTS

A first embodiment of the present invention is applied to fabricate ULSI N-type MOSFET with a SOI structure. The detailed processes will be described as follows.

Figure 1A:
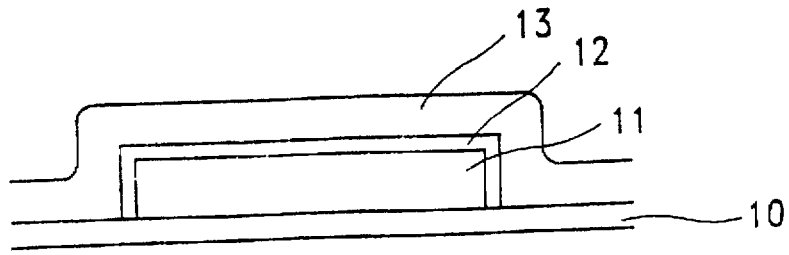
FIGS. 1a to 1d show cross-sectional views of the conventional ULSI MOSFET with SOI structure.
Figure 1B:
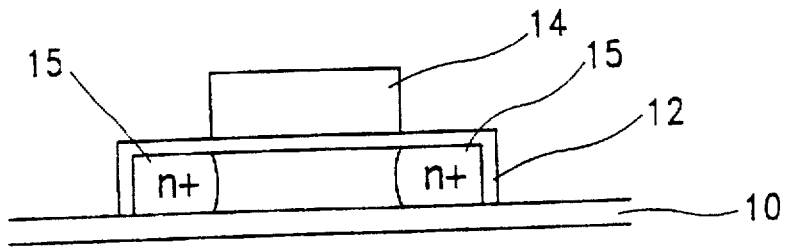
Figure 1C:
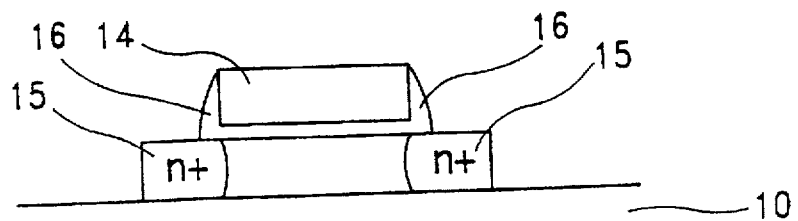
Figure 1D:
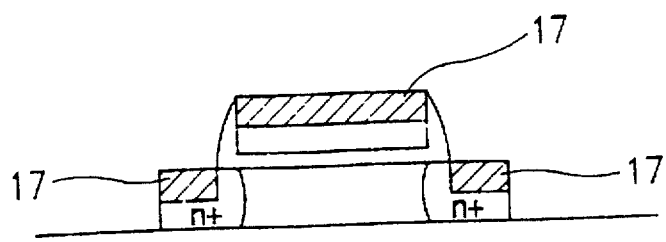
Figure 2:
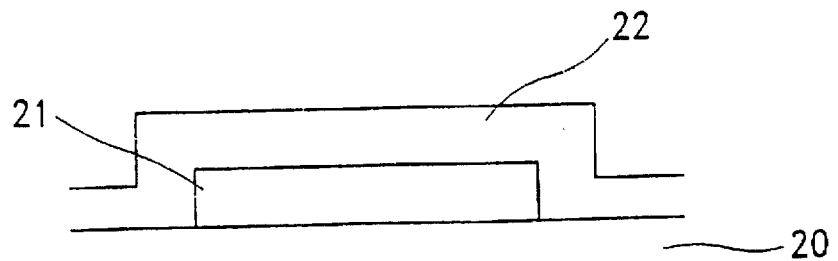
FIGS. 2 to 10 show cross-sectional views of the ULSI MOSFET with SOI structure according to the present invention.

As shown in FIG. 2, a P well 21 is formed on an oxide layer 20 by using conventional technique. Then a first polysilicon layer 22 is deposited on the P well 21 and over the oxide layer 20. Usually, the thickness of the first polysilicon layer 22 is between 500 to 1500 angstrom. The first polysilicon layer 22 is used to act as a reaction layer, which reacts with metal to form the salicides. The first polysilicon layer 22 can also prevent the thickness of source and drain regions being reduced during the process of forming salicides.

Figure 3:
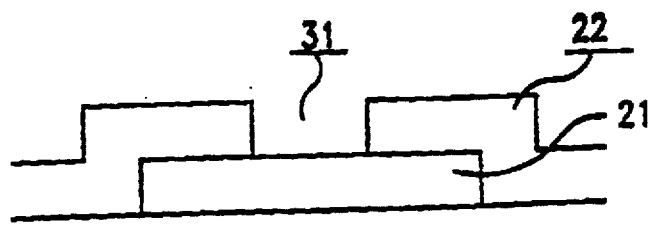

As shown in FIG. 3, a first photoresist layer is formed on the first polysilicon layer 22 a conventional photolithography technique is used to define a channel region. The first polysilicon layer 22 is then etched to form the channel region 31.

Figure 4:
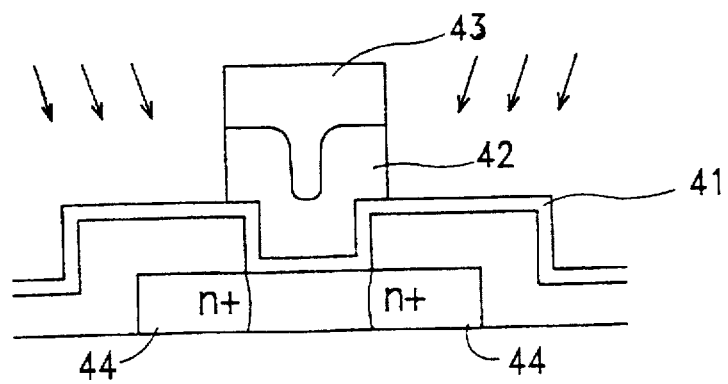

As shown in FIG. 4, a gate oxide layer 41 is formed conformally on the first polysilicon layer 22 and the P well 21. A doped gate polysilicon layer 42 is formed over the channel region 31 and on the gate polysilicon layer 41. The thickness of the doped gate polysilicon layer 42 is between 500 to 1500 angstrom. A second photoresist layer 43 is coated on the doped gate polysilicon layer 42 and to define a gate electrode region. Then, the gate polysilicon layer 42 is etched by using the second photoresist 43 as a mask to form a polysilicon gate 42. N-type impurities are obliquely implanted to form source and drain regions 44. The impurities could be P31 (phosphorus) or As (arsenic). The concentration of impurities should be between $1 \times 10^{15}$ to $5 \times 10^{15}$ ions/cm$^3$. The kinetic energy of the impurities should be between 30 to 80 KeV.

Figure 5:
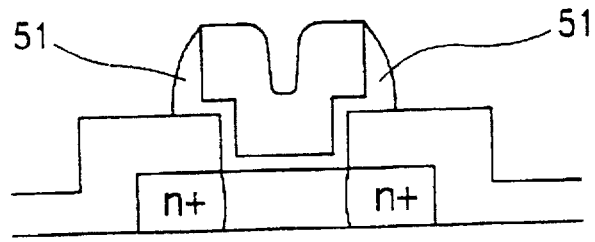

As shown in FIG. 5, the photoresist 43 is removed. A silicon dioxide layer is deposited on the polysilicon gate 42 and the side wall of the polysilicon gate 42. Then, the silicon dioxide layer is etched by dry etching method to form gate sidewall spacers 51.

Figure 6:
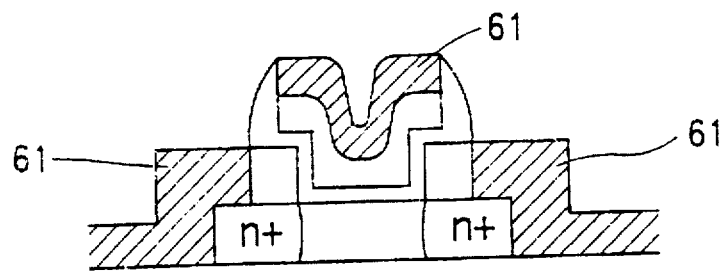

As shown in FIG. 6, a metal layer is deposited on the gate 42, source, and drain regions. The metal could be Ti or Ni. The thickness of the metal layer could be between 400 to 500 angstrom. A rapid thermal process is performed at about 600 to 800° C. The metal layer will react with silicon to form salicide on the gate 42 and residual part of the first polysilicon layers 32. Since metal can not react with silicon dioxide, there is no salicide formed on the gate sidewall spacers 51. Residual metal is removed using an etchant etch the metal selectively. The etchant contains the mixture of mixed $H_2O$, $H_2O_2$, and $NH_4OH$ with a ratio of 5:1:1. After that, the final structure of the N-type MOSFET with SOI structure according to the present invention is shown in FIG. 6. The polysilicons on the gate and the source and drain regions have reacted with metal respectively, and formed the salicides 61 to reduce the sheet resistivity.

Figure 7:
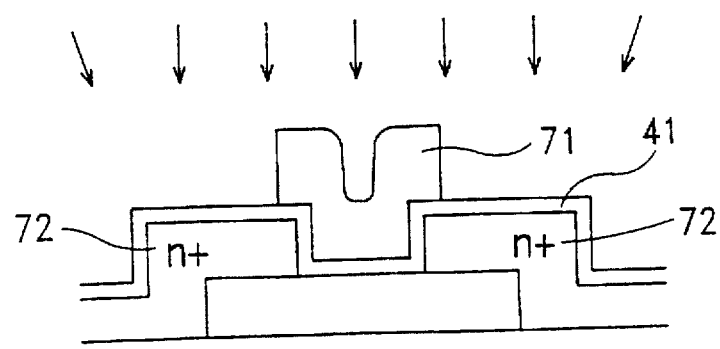
Figure 8:
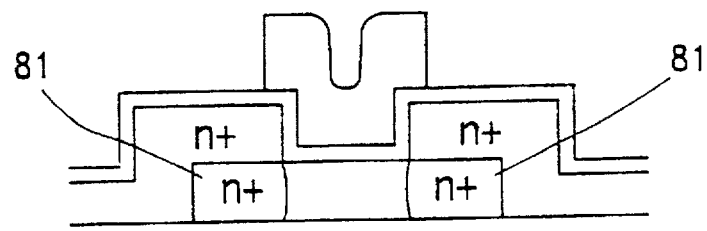
Figure 9:
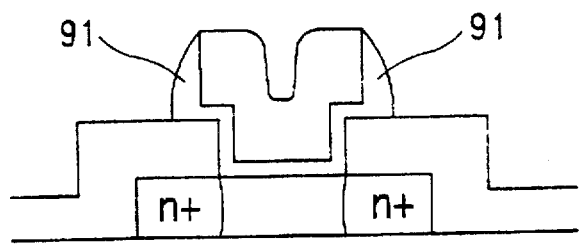
Figure 10:
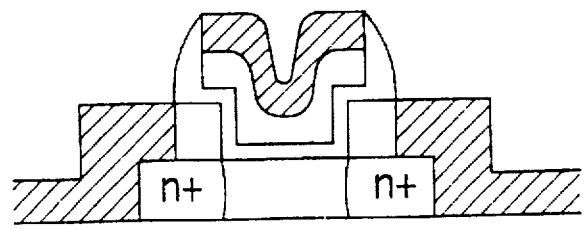

The second embodiment of the present invention is illustrated in FIGS. 7 to 10. Most of the procedures of the second embodiment of the present invention are similar to those of the first embodiment. One of the difference is that, gate polysilicon layer 71 is undoped. Besides, while forming source and drain regions, N-type impurities are obliquely implanted into the polysilicon layers 31 with a kinetic energy between 20 to 60 KeV and concentration between $1\times10^{15}$ to $5\times10^{15}$ ions/cm$^3$ as shown in FIG. 7. After implantation, an annealing process is performed to drive the implanted impurities into the P well at the temperature between 800° to 900° C. and form the source and drain regions 81 as shown in FIG. 8. The Residual metal on the sidewall spacers 91 are removed by selective etching as shown in FIG. 9. The final structure is shown in FIG. 10.

As stated above, in the present invention, a polysilicon layer is deposited on the source and drain regions and then formed the salides as metal contacts. Therefore, the thickness of the source and drain regions will not be reduced due to the metal contact formation. As a result, the thickness of the source and drain regions could be controlled to prevent the deficiencies of conventional ULSI MOSFET with SOI structure, such as leakage current and short channel effect.

It should be noted that the present invention can be applied to either a P-type substrate or an N-type substrate. Since the interchange of P-type and N-type is well known to those skilled in the art, this is not further discussed hereinafter.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating a ULSI MOSFET with SOI (semiconductor-on-insulator) structure on a wafer, said process comprising the following steps of:

forming an oxide layer over said wafer;
    forming a first conductive type well on said oxide layer;
    depositing a first polysilicon layer on said first conductive type well and over said oxide layer;
    forming a photoresist layer on said first polysilicon layer, and defining a channel region;
    etching said first polysilicon layer by using said photoresist layer as a mask thereby forming said channel region;
    forming a gate oxide layer on said first polysilicon layer and said channel region;
    forming a doped polysilicon layer on said gate oxide layer;
    patterning said doped polysilicon layer to form a gate electrode;
    obliquely implanting a second conductive type of impurities into said first conductive type well to form source and drain regions;
    forming side wall spacers on the side walls of said gate electrode;
    forming a metal layer on said gate electrode, and said first polysilicon layer;
    performing a rapid thermal process on said metal layer to form a salicide layer on said gate electrode, said source and drain regions, respectively; and
    etching said salicide layers and said remaining metal layer thereby leaving salicide layer on said gate electrode, said source and drain regions, respectively.

2. A process as claimed in claim 1, wherein the thickness of said first conductive type well is 500 to 1500 Å.

3. A process as claimed in claim 1, wherein the thickness of said doped polysilicon layer is 500 to 1500 Å.

4. A process as claimed in claim 1, wherein said metal layer is titanium or nickel.

5. A process as claimed in claim 1, wherein the thickness of said metal layer is 400 to 500 Å.

6. A process as claimed in claim 1, wherein said second conductive type impurities can be P31 (phosphrus) or As (arsenic).

7. A process as claimed in claim 6, wherein said implanting of said second conductive type of impurities is at a energy between about 30 to 80 Kev and a concentration between about $1\times10^{15}$ to $5\times10^{15}$ ions/CM$^3$.

8. A process as claimed in claim 1, wherein said rapid thermal process is performed at 600° to 800° C.

9. A process as claimed in claim 1, wherein said etching of said salicide layer and metal layer include using an etchant containing the mixture of $H_2O$, $H_2O_2$, and $NH_4OH$ with a ratio of 5:1:1.

10. A process for fabricating a ULSI MOSFET with SOI (semiconductor-on-insulator) structure on a wafer, said process comprising the following steps of:

forming an oxide layer over said wafer;
    forming a first conductive type well on said oxide layer;
    depositing a first polysilicon layer on said first conductive type well and over said oxide layer;
    forming a photoresist layer on said first polysilicon layer, and defining a channel region;
    etching said first polysilicon layer by using said photoresist layer as a mask thereby forming a channel region;
    forming a gate oxide layer on said first polysilicon layer and said channel region;
    forming a second polysilicon layer on said gate oxide layer;
    patterning said second polysilicon layer to form a gate electrode;
    obliquely implanting a second conductive type of impurities into said first polysilicon layer;
    performing a heat treatment to drive said second conductive type impurities into said first conductive type well region;
    forming side wall spacers on the side walls of said gate electrode;
    forming a metal layer on said gate electrode, and said first polysilicon layer;
    performing a rapid thermal process on said metal layer to form a salicide layer on said gate, said source and drain regions, respectively; and etching said salicide layers and any of the remaining metal layer thereby leaving salicide layer on said gate electrode, said source and drain regions, respectively.

11. A process as claimed in claim 10, wherein the thickness of said first conductive type well is 500 to 1500 Å.

12. A process as claimed in claim 10, wherein the thickness of said second polysilicon layer is 500 to 1500 Å.

13. A process as claimed in claim 10, wherein said metal layer is titanium or nickel.

14. A process as claimed in claim 10, wherein the thickness of said metal layer is 400 to 500 Å.

15. A process as claimed in claim 10, wherein said implanting of said second conductive type of impurities is at a energy between about 20 to 60 Kev and a concentration between about $1 \times 10^{15}$ to $5 \times 10^{15}$ ions/cm$^3$.

16. A process as claimed in claim 10, wherein said heat treatment is performed at 800° to 900° C.

* * * * *